United States Patent
Koes et al.

(10) Patent No.: US 6,818,375 B2
(45) Date of Patent: Nov. 16, 2004

(54) PHOTORESIST COMPOSITION

(75) Inventors: Thomas A. Koes, Riverside, CA (US); Todd Johnson, Corona, CA (US)

(73) Assignee: Eternal Technology Corporation, Colonia Heights, VA (US)

( * ) Notice: Subject to any disclaimer, the term of this patent is extended or adjusted under 35 U.S.C. 154(b) by 102 days.

(21) Appl. No.: 09/995,921

(22) Filed: Nov. 28, 2001

(65) Prior Publication Data

US 2002/0132180 A1 Sep. 19, 2002

Related U.S. Application Data

(60) Provisional application No. 60/253,531, filed on Nov. 28, 2000.

(51) Int. Cl.[7] ........................... G03C 1/73; G03C 1/805; G03F 7/028; G03F 7/032; G03F 7/30

(52) U.S. Cl. ............................... 430/270.1; 430/281.1; 430/285.1; 430/311; 430/319; 430/325; 430/326; 430/905; 430/914; 430/916; 430/919; 430/920; 430/923; 430/921; 430/922; 430/924; 430/925

(58) Field of Search ............................ 430/270.1, 281.1, 430/916, 311, 285.1, 319, 325, 326, 905, 914, 919, 920, 923, 921, 922, 924, 925

(56) References Cited

U.S. PATENT DOCUMENTS

| | | | |
|---|---|---|---|
| 3,479,185 A | | 11/1969 | Chambers et al. |
| 4,065,315 A | * | 12/1977 | Yamazaki et al. .......... 430/269 |
| 4,189,323 A | | 2/1980 | Buhr |
| 4,251,619 A | | 2/1981 | Kurita |
| 4,332,884 A | | 6/1982 | Uji-Ie et al. |
| 4,555,473 A | | 11/1985 | Dueber et al. |
| 4,634,657 A | | 1/1987 | Holman, III |
| 4,889,793 A | * | 12/1989 | Taniguchi et al. ....... 430/281.1 |
| 4,935,330 A | | 6/1990 | Hofmann et al. |
| 5,030,548 A | | 7/1991 | Fujikura et al. |
| 5,217,843 A | | 6/1993 | Dammel et al. |
| 5,264,329 A | | 11/1993 | Wade et al. |
| 5,407,783 A | | 4/1995 | Caruso |
| 5,489,499 A | | 2/1996 | Yumoto |
| 5,668,080 A | | 9/1997 | Cove et al. |
| 5,821,016 A | * | 10/1998 | Satoh et al. .................... 430/7 |
| 5,952,153 A | | 9/1999 | Lundy et al. |

OTHER PUBLICATIONS

Database WPI Section Ch, Week 199047, Derwent Publications Ltd., London GB; AN 1990–351553, XP002194516 & JP 02 253260 A (Tosoh Corp), Oct. 12, 1990—Abstract.

* cited by examiner

*Primary Examiner*—Mark F. Huff
*Assistant Examiner*—Sin J. Lee
(74) *Attorney, Agent, or Firm*—Scully, Scott, Murphy & Presser

(57) ABSTRACT

Disclosed are photoimageable compositions having improved stripping properties including a photoresist strip enhancer. Also disclosed are methods of enhancing the strippability of photoimageable compositions and methods for manufacturing printed wiring boards using such photoimageable compositions.

7 Claims, No Drawings

PHOTORESIST COMPOSITION

This application claims the benefit of U.S. Provisional Application No. 60/253,531 FILING DATE Nov. 28, 2000.

BACKGROUND OF THE INVENTION

This invention relates generally to the field of photoresists. In particular, this invention relates to the field of photoresists having improved stripping properties, especially suitable for use in printed wiring board manufacture.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or cross-link in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

A wide variety of polymeric or resin binders may be used in photoresists. Such polymeric binders may include, as polymerized components, one or more acid functional monomers such as acrylic acid or methacrylic acid. For example, U.S. Pat. No. 5,952,153 (Lundy et al.) discloses photoimageable compositions containing as a polymeric binder having sufficient acid functionality to render the photoimageable composition developable in alkaline aqueous solution.

Photoresists may be either liquid or dry film. Liquid photoresists are dispensed on a substrate and then cured. Dry film photoresists are typically laminated to a substrate. Such dry film photoresists are particularly suitable for use in printed wiring board manufacture. One problem with conventional dry film photoresist compositions is that they are difficult to strip from electrolytically plated circuit boards using conventional alkaline aqueous stripping solutions, e.g. 3% sodium hydroxide solution. This problem arises from the demand of circuit board manufacturers to reduce the size of printed circuit boards, while increasing their functional capabilities. Consequently, the circuit lines and spaces on the circuit boards have continued to shrink, as more circuitry needs to be accommodated in smaller spaces. At the same time, metal plating heights have also increased above the thickness of the photoresist. This causes the metal to hang over the photoresist, resulting in a very narrow space containing the photoresist being virtually encapsulated by the overplated metal. The photoresist then becomes trapped by the plated overhang, making it difficult to attack and strip by conventional methods. If the photoresist is not completely stripped or removed, ragged copper circuit lines will result after etching which are unsuitable as they can cause short circuiting of the board.

Some circuit board manufacturers have tried thicker photoresists to accommodate the increasing plating heights, however, this approach is more expensive and limits resolution of the circuit lines. Typically, organic-based (amine- or organic solvent-containing) alkaline stripping solutions are used which produce a smaller stripped particle to facilitate stripping. While such organic-based strippers remove the resist better, they are expensive relative to inorganic-based strippers (e.g. sodium or potassium hydroxide) and have more waste treatment and environmental concerns associated with them. Solvent-strippable photoresists are much less desirable due to workplace regulations limiting or reducing solvent emissions.

It is thus desirable to provide photoresist compositions that are easily removed using alkaline aqueous inorganic-based stripping solutions.

A wide variety of trihalomethyl-substituted compounds are known, particularly as photoactive components. For example, U.S. Pat. No. 4,935,330 (Hofmann et al.) discloses trihalomethyl-substituted triazines as a photoactive component in the production of lithographic printing plates.

U.S. Pat. No. 5,668,080 (Cove et al.) discloses thermally responsive recording material including a support having provided thereon in substantially contiguous relationship an electron donating dye precursor and alpha-trichloromethylbenzyl acetate. Photoresist compositions are neither disclosed nor suggested in this patent.

SUMMARY OF THE INVENTION

It has been surprisingly found that the addition of one or more non-polymerizable photoresist strip enhancers provide photoimageable compositions having improved stripability or removability. Such photoresist strip enhancers are compounds containing one or more trihalomethyl-substituents in an alpha position relative to a group capable of stabilizing a negative charge. It has also been surprisingly found that such non-polymerizable photoresist strip enhancers do not adversely affect other properties of the photoresist binder such as chemical resistance. Thus, the present compositions show improved stripping with substantially no loss of chemical resistance, as compared to the same compositions free of non-polymerizable photoresist strip enhancers.

In one aspect, the present invention provides a photoresist composition including a polymeric binder, a photoactive component, a photoresist strip enhancer and optionally a cross-linking agent, wherein the photoresist strip enhancer is non-polymerizable with the polymeric binder, optional cross-linking agent or both and has the formula

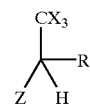

wherein each X is independently chlorine, bromine, fluorine or iodine; Z=cyano, aryl, substituted aryl, C(Y)—$R^1$, C≡C—$R^2$ and C($R^3$)=C$R^4R^5$; Y=oxygen or sulfur; R=Z, hydrogen, ($C_1$–$C_4$)alkyl, ($C_1$–$C_4$)alkoxy, substituted ($C_1$–$C_4$)alkyl, substituted ($C_1$–$C_4$)alkoxy; $R^1$=($C_1$–$C_8$)alkyl, ($C_1$–$C_8$)alkoxy, substituted ($C_1$–$C_8$)alkyl, substituted ($C_1$–$C_8$)alkoxy, aryl or substituted aryl; $R^2$=hydrogen, ($C_1$–$C_8$)alkyl, substituted ($C_1$–$C_8$)alkyl, aryl or substituted aryl; and $R^3$, $R^4$ and $R^5$ are independently selected from hydrogen, halogen or $R^1$.

In a second aspect, the present invention provides a method of enhancing the removal of a photoresist composition from a substrate including the step of combining a photoresist strip enhancer with a photoresist composition including polymeric binder, a photoactive component and optionally a cross-linking agent, wherein the photoresist strip enhancer is non-polymerizable with the polymeric binder, optional cross-linking agent or both and has the formula

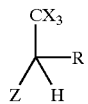

wherein each X is independently chlorine, bromine, fluorine or iodine; Z=cyano, aryl, substituted aryl, $C(Y)$—$R^1$, $C\equiv C$—$R^2$ and $C(R^3)$=$CR^4R^5$; Y=oxygen or sulfur; R=Z, hydrogen, $(C_1-C_4)$alkyl, $(C_1-C_4)$alkoxy, substituted $(C_1-C_4)$alkyl, substituted $(C_1-C_4)$alkoxy; $R^1$=$(C_1-C_8)$alkyl, $(C_1-C_8)$alkoxy, substituted $(C_1-C_8)$alkyl, substituted $(C_1-C_8)$alkoxy, aryl or substituted aryl; $R^2$=hydrogen, $(C_1-C_8)$alkyl, substituted $(C_1-C_8)$alkyl, aryl or substituted aryl; and $R^3$, $R^4$ and $R^5$ are independently selected from hydrogen, halogen or $R^1$.

In a third aspect, the present invention provides a method of manufacturing a printed wiring board including the steps of: a) disposing on a printed wiring board substrate a photoresist composition including a polymeric binder, a photoactive component, a photoresist strip enhancer and optionally a cross-linking agent, wherein the organic acid is non-polymerizable with the polymeric binder and optional cross-linking agent and has the formula

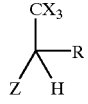

wherein each X is independently chlorine, bromine, fluorine or iodine; Z=cyano, aryl, substituted aryl, $C(Y)$—$R^1$, $C\equiv C$—$R^2$ and $C(R^3)$=$CR^4R^5$; Y=oxygen or sulfur; R=Z, hydrogen, $(C_1-C_4)$alkyl, $(C_1-C_4)$alkoxy, substituted $(C_1-C_4)$alkyl, substituted $(C_1-C_4)$alkoxy; $R^1$=$(C_1-C_8)$alkyl, $(C_1-C_8)$alkoxy, substituted $(C_1-C_8)$alkyl, substituted $(C_1-C_8)$alkoxy, aryl or substituted aryl; $R^2$=hydrogen, $(C_1-C_8)$alkyl, substituted $(C_1-C_8)$alkyl, aryl or substituted aryl; and $R^3$, $R^4$ and $R^5$ are independently selected from hydrogen, halogen or $R^1$; b) imaging the photoresist; and c) developing the photoresist.

In a fourth aspect, the present invention provides a method of enhancing the removal of a photoresist composition from a substrate including the step of combining a curing agent having a net acrylate functionality of about 2 or greater with a photoresist composition including polymeric binder and photoactive component.

DETAILED DESCRIPTION OF THE INVENTION

As used throughout this specification, the following abbreviations shall have the following meanings, unless the context clearly indicates otherwise: ° C.=degrees Centigrade; g=grams; mg=milligrams; Tg=glass transition temperature; ° F.=degrees Fahrenheit; wt %=percent by weight; and mil=0.001 inch.

The terms "resin" and "polymer" are used interchangeably throughout this specification. The term "alkyl" refers to linear, branched and cyclic alkyl. The terms "halogen" and "halo" include fluorine, chlorine, bromine, and iodine. Thus the term "halogenated" refers to fluorinated, chlorinated, brominated, and iodinated. "Polymers" refer to both homopolymers and copolymers and include dimers, trimers, oligomers and the like. The term "(meth)acrylate" refers to both acrylate and methacrylate. Likewise, the term "(meth) acrylic" refers to both acrylic and methacrylic. "Monomer" refers to any ethylenically or acetylenically unsaturated compound capable of being polymerized. The terms "cross-linker" and "cross-linking agent" are used interchangeably throughout this specification. The terms "printed wiring board" and "printed circuit board" are used interchangeably throughout this specification.

All amounts are percent by weight and all ratios are by weight, unless otherwise noted. All numerical ranges are inclusive and combinable.

The photoresist compositions of the present invention include a polymeric binder, a photoactive component, a photoresist strip enhancer and optionally a cross-linking agent, wherein the photoresist strip enhancer is non-polymerizable with the polymeric binder, optional cross-linking agent or both and has the formula

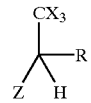

wherein each X is independently chlorine, bromine, fluorine or iodine; Z=cyano, aryl, substituted aryl, $C(Y)$—$R^1$, $C\equiv C$—$R^2$ and $C(R^3)$=$CR^4R^5$; Y=oxygen or sulfur; R=Z, hydrogen, $(C_1-C_4)$alkyl, $(C_1-C_4)$alkoxy, substituted $(C_1-C_4)$alkyl, substituted $(C_1-C_4)$alkoxy; $R^1$=$(C_1-C_8)$alkyl, $(C_1-C_8)$alkoxy, substituted $(C_1-C_8)$alkyl, substituted $(C_1-C_8)$alkoxy, aryl or substituted aryl; $R^2$=hydrogen, $(C_1-C_8)$alkyl, substituted $(C_1-C_8)$alkyl, aryl or substituted aryl; and $R^3$, $R^4$ and $R^5$ are independently selected from hydrogen, halogen or $R^1$.

A wide variety of polymeric binders are suitable for use in the present invention. Suitable polymeric binders are those containing as polymerized units one or more ethylenically or acetylenically unsaturated monomers. Suitable monomers include, but are not limited to: (meth)acrylic acid, (meth)acrylamides, alkyl (meth)acrylates, alkenyl (meth) acrylates, aromatic (meth)acrylates, vinyl aromatic monomers, nitrogen-containing compounds and their thio-analogs, substituted ethylene monomers, cyclic olefins, substituted cyclic olefins, and the like. Preferred monomers include (meth)acrylic acid, alkyl (meth)acrylates and vinyl aromatic monomers. Such polymeric binders may be homopolymers or copolymers and preferably copolymers. It will be further appreciated that a mixture of binder polymers may be used in the present invention. Thus, the present photoimageable compositions may include one or more polymeric binders.

Typically, the alkyl (meth)acrylates useful in the present invention are $(C_1-C_{24})$alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$–$C_6$)alkyl (meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or HPMA.

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri ($C_1$–$C_6$)alkylsilyl (meth)acrylate, γ-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxydi($C_1$–$C_6$) alkylsilyl (meth)acrylate, vinyl tri($C_1$–$C_6$)alkylsilyl (meth) acrylate, 2-propylsilsesquioxane (meth)acrylate and mixtures thereof.

The vinyl aromatic monomers useful as unsaturated monomers in the present invention include, but are not limited to: styrene ("STY"), hydroxystyrene, α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$)alkyl, carb($C_1$–$C_{10}$) alkoxy, carboxy, amino, ($C_1$–$C_{10}$)alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl ($C_1$–$C_8$) substituted N-vinyl pyridines such as 2-methyl-5-vinylpyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride, vinylidene bromide, tetrafluoroethylene, trifluoroethylene, trifluoromethyl vinyl acetate, vinyl ethers and itaconic anhydride.

Suitable cyclic olefin monomers useful in the present invention are ($C_5$–$C_{10}$)cyclic olefins, such as cyclopentene, cyclopentadiene, dicylopentene, cyclohexene, cyclohexadiene, cycloheptene, cycloheptadiene, cyclooctene, cyclooctadiene, norbornene, maleic anhydride and the like. Such cyclic olefins also include spirocyclic olefin monomers such as spirocyclic norbornenyl monomers, spirocyclic cyclohexene monomers, spirocyclic cyclopentene monomers and mixtures thereof. Suitable substituted cyclic olefin monomers include, but are not limited to, cyclic olefins having one or more substituent groups selected from hydroxy, aryloxy, halo, ($C_1$–$C_{12}$)alkyl, ($C_1$–$C_{12}$)haloalkyl, ($C_1$–$C_{12}$)hydroxyalkyl, ($C_1$–$C_{12}$) halohydroxyalkyl such as $(CH_2)_{n'}C(CF_3)_2OH$ where n'=0 to 4, ($C_1$–$C_{12}$)alkoxy, thio, amino, ($C_1$–$C_6$)alkylamino, ($C_1$–$C_6$)dialkylamino, ($C_1$–$C_{12}$)alkylthio, carbo($C_1$–$C_{20}$) alkoxy, carbo($C_1$–$C_{20}$)haloalkoxy, ($C_1$–$C_{12}$)acyl, ($C_1$–$C_6$) alkylcarbonyl($C_1$–$C_6$)alkyl, and the like. Particularly suitable substituted cyclic olefins include maleic anhydride and cyclic olefins containing one or more of hydroxy, aryloxy, ($C_1$–$C_{12}$)alkyl, ($C_1$–$C_{12}$)haloalkyl, ($C_1$–$C_{12}$)hydroxyalkyl, ($C_1$–$C_{12}$)halohydroxyalkyl, carbo($C_1$–$C_{20}$)alkoxy, and carbo($C_1$–$C_{20}$)haloalkoxy. It will be appreciated by those skilled in the art that the alkyl and alkoxy substituents may be optionally substituted, such as with halogen, hydroxyl, cyano, ($C_1$–$C_6$)alkoxyl, mercapto, ($C_1$–$C_6$)alkylthio, amino, acid labile leaving group and the like. Suitable carbo ($C_1$–$C_{20}$)alkoxy substituents include, but are not limited to, those of the formula C(O)O—LG, wherein LG is a leaving group including, but are not limited to, alkyl groups having 4 or more carbon atoms with at least one quaternary carbon atom bonded directly to a carboxylate oxygen such as tert-butyl esters, 2,3-dimethylbutyl esters, 2-methylpentyl esters, 2,3,4-trimethylpentyl esters, alicyclic esters, acetals or ketals from vinyl ethers or enols such as —O—(CH(CH$_3$) OC$_2$H$_5$) or —O—(CH$_2$OC$_2$H$_5$), tetrahydropyran ("THP"). Suitable alicyclic esters as leaving groups include adamantyl, methyladamantyl, ethyladamantyl, methylnorbornyl, ethylnorbornyl, ethyltrimethylnorbornyl, ethyl fenchol and the like.

It is further preferred that the polymeric binders contain sufficient acid functionality to render the binder polymers soluble and removable upon development. The term "acid functionality" refers to any functionality capable of forming a salt upon contact with alkaline developer, such as dilute alkaline aqueous sodium or potassium hydroxide, e.g. 1–3 wt % solutions. Suitable acid functionality includes, but is not limited to, carboxylic acids, sulfonic acids, phosphonic acids and phenols. In general, the binder polymers have an acid number of up to about 250, preferably up to about 200. Typical ranges of acid numbers are from 15 to 250 and preferably from 50 to 250. Such acid numbers are based on the amount of potassium hydroxide ("KOH") in mg to neutralize 1 g (dry weight) of binder polymer.

Suitable polymeric binders are generally commercially available from a variety of sources, such as Rohm and Haas Company (Philadelphia, Pa.) or may be prepared by a variety of methods known in the literature. Typically, the polymeric binder is present in the photoimageable compositions in an amount of up to 90 wt %, based on the total weight of the composition, preferably from 20 to 90 wt %, more preferably from 25 to 85 wt %, and even more preferably from 30 to 80 wt %.

A wide variety of photoresist strip enhancers may be used in the present invention, provided that the photoresist strip enhancer is non-polymerizable with the polymeric binder, optional cross-linking agent or both or otherwise incorporated into the binder polymer or cross-linking agent. Thus, the photoresist strip enhancers useful in the present invention are substantially non-incorporated, and preferably not incorporated, into the binder polymer or cross-linking agent upon curing. Such photoresist strip enhancers are compounds containing one or more trihalomethyl-substituents in an alpha position relative to a group capable of stabilizing a negative charge. While not intending to be bound by theory, it is believed that such trihalomethyl-substituted compounds form carboxylate anions during the alkaline photoresist stripping step. Thus, any trihalomethyl-substituted compounds which form such carboxylate anions may suitably be used in the present invention.

Suitable photoresist strip enhancers are those having the formula

wherein each X is independently chlorine, bromine, fluorine or iodine; Z=cyano, aryl, substituted aryl, —C(Y)—R$^1$, —O—C(Y)—R$^1$, —C≡C—R$^2$ and —C(R$^3$)=CR$^4$R$^5$; Y=oxygen or sulfur; R=Z, hydrogen, ($C_1$–$C_4$)alkyl, ($C_1$–$C_4$) alkoxy, substituted ($C_1$–$C_4$)alkyl, substituted ($C_1$–$C_4$) alkoxy; R$^1$=($C_1$–$C_8$)alkyl, ($C_1$–$C_8$)alkoxy, substituted ($C_1$–$C_8$)alkyl, substituted ($C_1$–$C_8$)alkoxy, aryl or substituted aryl; R$^2$=hydrogen, ($C_1$–$C_8$)alkyl, substituted ($C_1$–$C_8$)alkyl, aryl or substituted aryl; and R$^3$, R$^4$ and R$^5$ are independently selected from hydrogen, halogen or R$^1$. By "substituted alkyl" or "substituted alkoxy" it is meant that one or more hydrogens from the alkyl or alkoxy group is replaced by one or more other substituent groups, such as halogen, hydroxyl, ($C_1$–$C_6$)alkoxy, phenyl, phenoxy, substituted phenyl, cyano and the like. Likewise, by "substituted aryl" or "substituted phenyl" it is meant that one or more hydrogens from the aryl or phenyl groups is replaced with one or more substituent groups, such as halogen, ($C_1$–$C_6$)alkyl, ($C_1$–$C_6$)alkoxy, phenyl, phenoxy, substituted phenyl, cyano and the like.

Preferred photoresist strip enhancers are those wherein at least one of Z and R is aryl or alkenyl, and more preferably phenyl or alkenyl. It is further preferred that R is phenyl or alkenyl and Z is aryl, —C(Y)—R$^1$ or —O—C(Y)—R$^1$. Exemplary photoresist strip enhancers include, but are not limited to, alpha-trichloromethyl benzyl acetate, alpha-tribromomethyl benzyl acetate, alpha-triiodomethyl benzyl acetate, trichloromethyl allyl acetate, tribromomethyl allyl acetate, alpha-trichloromethyl benzyl propionate, alpha-tribromomethyl benzyl propionate, alpha-triiodomethyl benzyl propionate, trichloromethyl allyl propionate, tribromomethyl allyl propionate, alpha-trichloromethyl benzyl benzoate, alpha-tribromomethyl benzyl benzoate, alpha-triiodomethyl benzyl benzoate, trichloromethyl allyl benzoate, tribromomethyl allyl benzoate and alpha-bromodichloromethyl benzyl acetate.

It will be appreciated by those skilled in the art that more than one photoresist strip enhancer compound may be advantageously used in the present compositions. Thus, the present photoimageable compositions may include one or more photoresist strip enhancers. It will be further appreciated by those skilled in the art that as the amount of non-polymerizable photoresist strip enhancer is increased in the present compositions, polymeric binders having less acid functionality may be used with substantially no loss of stripping ability. Thus, polymeric binders having other improved properties such as increased chemical resistance, but less desirous stripping properties may be used in combination with the present photoresist strip enhancers to provide photoimageable compositions that can still be easily removed.

The photoresist strip enhancers are generally commercially available from a wide variety of sources, such as Aldrich Chemical Co. (Milwaukee, Wis.) and may be used without further purification. In general, the present compositions include one or more photoresist strip enhancers in an amount of up to about 10 wt %, based on the total dry weight of the binder polymer, preferably in an amount of up to about 8 wt %, and more preferably up to about 5 wt %. Preferably, the one or more photoresist strip enhancers are present in an amount of 0.125 wt % or greater. The photoresist strip enhancers are preferably present in an amount of from 0.5 to 5 parts per 40 parts of polymeric binder on a dry weight/weight basis.

Suitable cross-linkers useful in the present invention include di-, tri-, tetra-, or higher multi-functional ethylenically unsaturated monomers. Examples of cross-linkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate ("TMPTA"), diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, ethoxylated diacrylates, ethoxylated triacrylates such as ethoxylated TMPTA and ethoxylated TMPTMA, ethoxylated tetraacrylates, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane), glycosyl ureas including di-, tri- and tetra-glycosyl ureas, epoxies and mixtures thereof. Such cross-linking agents are generally commercially available.

It will be appreciated by those skilled in the art that desired properties may be imparted to the photoimageable composition by combining two or more cross-linking agents. Thus, mixtures of cross-linking agents may advantageously be used in the present invention. The present photoresist compositions preferably include one or more cross-linking agents. Typically, such cross-linking agents are present in the photoimageable compositions in an amount of from 5 to 75 wt %, preferably from 15 to 70 wt %, and more preferably from 20 to 65 wt %.

In an alternative embodiment, one or more monomers may be advantageously combined with the one or more cross-linking agents to provide a curing agent system. In such curing agent systems, the one or more monomers are typically selected so as to provide certain desired properties in the cured photoresist. For example, a (meth)acrylate functional cross-linker may be combined with one or more monomers, preferably one or more (meth)acrylate monomers. The term "(meth)acrylate functional cross-linker" refers to cross-linking agents having one or more, preferably two or more, (meth)acrylate groups, i.e. groups of the formula $H_2C{\equiv}C(H$ or $CH_3)C(O)$—O—. Typically, the amounts of the cross-linking agent and monomer in the curing agent system are selected so as to provide a desired net (meth)acrylate functionality. The term "net (meth)acrylate functionality" refers to the average (meth)acrylate functionality of the components in the curing agent. Such net (meth)acrylate functionality is determined by averaging, on a weight basis, the amount of multi-(meth)acrylate functionality compound, i.e. cross-linking agent, and mono-(meth)acrylate functionality compound, i.e. (meth)acrylate monomer. For example, when a triacrylate cross-linking agent, such as TMPTA, and an acrylate monomer, i.e. a compound having one acrylate group, are used in a 1:1 admixture by weight, the net (meth)acrylate functionality is about 2. It is preferred that a curing agent system is used as the cross-linking agent in the present photoimageable compositions.

The net (meth)acrylate functionality is selected so as to balance the chemical resistance of the photoresist with the ease of stripping or removing such photoresist. Generally, increasing the branching of the cured photoresist, i.e. increasing the amount of cross-linking, increases the chemical resistance. Decreasing the branching of the cured photoresist, i.e. decreasing the amount of cross-linking, increases the strippability of the cured photoresist but decreases the chemical resistance of the cured photoresist. It has been surprisingly found that a net (meth)acrylate functionality of about 2 provides very good chemical resistance while providing for enhanced strippability of the cured photoresist. Increasing the net (meth)acrylate functionality above 2 increase the chemical resistance of the cured photoresist, but adversely affects the ease of removing such cured photoresist. Decreasing the net (meth)acrylate functionality below 2 increases the strippability of the cured photoresist, but adversely affects the chemical resistance of the cured photoresist.

Thus, the present invention provides a method of enhancing the removal of a photoresist composition from a substrate including the step of combining a curing agent having a net (meth)acrylate functionality of about 2 or greater with a photoresist composition including polymeric binder and photoactive component. When the curing agent includes acrylate functionality, it is preferred that the net acrylate functionality is about 2 or greater, and more preferably about 2. When the curing agent includes methacrylate functionality, it is preferred that the net methacrylate functionality is less than 2. Preferably, the curing agent includes one or more acrylate cross-linking agents and one or more non-cross-linkable acrylate monomers. It is more preferred that the curing agent includes a triacrylate cross-linking agent and a non-cross-linkable acrylate monomer. Still more preferably, the curing agent includes ethoxylated TMPTA as the cross-linking agent and the reaction product of ε-caprolactone and HEA as the monomer. It is further preferred that the ratio of triacrylate cross-linking agent and non-cross-linkable acrylate monomer is about 1:1 by weight. It is even preferred that the curing agent is free of methacrylate functionality. When such curing agents systems are free of methacrylate, then they can be described as having a net acrylate functionality.

Also provided by the present invention is a photoimageable composition including one or more polymeric binders, one or more photoactive components and a curing agent system including one or more cross-linking agents and one or more monomers, wherein the curing agent system has a net (meth)acrylate functionality of about 2.

The photoimageable compositions of the present invention contain one or more photoactive components. The photoactive components useful in the present invention are may be photoacid generators, photobase generators or free-radical generators. The present photoimageable compositions may be positive-acting or negative-acting, and preferably are negative-acting. It will be appreciated by those skilled in the art that mixtures of photoactive components allow the photoactivity of the compositions to be tailored to specific applications.

Suitable photoacid generators include halogenated triazines, onium salts, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl) hydrazines and the like. Particularly useful halogenated triazines include halomethyl-s-triazines.

Suitable free-radical generators include, but are not limited to, n-phenylglycine, aromatic ketones such as benzophenone, N,N'-tetramethyl-4,4'-diaminobenzophenone [Michler's ketone], N,N'-tetraethyl-4,4'-diaminobenzophenone, 4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer, and the like. Though, not a free-radical generator, triphenylphosphine may be included in the photoactive chemical system as a catalyst. Such free-radical generators are particularly suitable for use with negative-acting photoimageable compositions, and particularly suitable for use with negative-acting dry film photoimageable compositions of the present invention.

Typically, such photoactive components are present in an amount of from 0.05 to 10 wt % based on the total weight of the composition, preferably from 0.1 to 5 wt %, and more preferably from 0.1 to 2 wt %.

The present photoimageable compositions may optionally contain a solvent. Suitable solvents include, but are not limited to: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof; cyclic ether solvents such as dioxane; ester solvents such as methyl lactate, ethyl lactate, methyl acetate, ethyl acetate, butyl acetate, methyl pyruvate, ethyl pyruvate, methyl methoxypropionate and ethyl ethoxypropionate; and amide solvents such as N,N-dimethyl formamide, N,N-dimethyl acetamide, N-methyl-2-pyrrolidone, 3-ethoxyethyl propionate, 2-heptanone, γ-butyrolactone, and mixtures thereof.

Optional additives that may be used in the present photoimageable compositions include, but are not limited to: anti-striation agents, plasticizers, speed enhancers, fillers, dyes, film forming agents, non-polymerizable organic acids and the like. Suitable plasticizers include esters such as dibenzoate esters. It is preferred that one or more non-polymerizable organic acids are added to the present photoimageable compositions. Such organic acids are substantially non-polymerizable with the polymeric binders, optional cross-linking agents or both. A wide variety of organic acids may suitably be added to the present photoresist compositions. Suitable organic acids include, but are not limited to, alkanecarboxylic acids and arylcarboxylic acids, sulfonic acids such as alkanesulfonic acids and arylsulfonic acids, phosphonic acids such as alkylphosphonic acids and arylphosphonic acids, and the like. Exemplary carboxylic acids include, but are not limited to, ($C_1$–$C_{12}$) alkylcarboxylic acids, ($C_1$–$C_{12}$)alkyldicarboxylic acids, ($C_1$–$C_{12}$)alkyltricarboxylic acids, substituted ($C_1$–$C_{12}$) alkylcarboxylic acids, substituted ($C_1$–$C_{12}$) alkyldicarboxylic acids, substituted ($C_1$–$C_{12}$) alkyltricarboxylic acids, amine carboxylic acids such as ethylenediamine tetraacetic acid, arylcarboxylic acids such as arylmonocarboxylic acids, aryldicarboxylic acids and aryltricarboxylic acids, and substituted arylcarboxylic acids. Preferred organic acids include formic acid, acetic acid, propionic acid, oxalic acid, malonic acid, succinic acid, glutaric acid, adipic acid, glycolic acid, lactic acid, tartaric acid, citric acid or malic acid, ethylenediamine tetraacetic acid, phthalic acid, benzene tricarboxylic acid, salicilic acid, cyclohexanecarboxylic acid, 1,4-cyclohexanedicarboxylic acid and sebacic acid.

Such optional additives will be present in various concentrations in a photoresist composition. For example, fillers and dyes may be used in relatively large concentrations, e.g. in amounts of from about 5 to 30 percent by weight, based on the total weight of the composition's dry components. Such organic acids are typically present in an amount of up to about 10 wt %, based on the total dry weight of the binder polymer, preferably in an amount of up to about 8 wt %, and more preferably up to about 5 wt %.

The photoresist composition of the present invention is typically prepared by combining the polymeric binder, photoactive component, photoresist strip enhancer, optional cross-linking agent, optional solvent and optional additives in any order.

Processing of the photoimageable or photoresist compositions of the invention may be in any conventional manner. In a typical procedure, a photoresist layer, either formed from a liquid composition or transferred as a layer from a dry film, is applied to a substrate. When a liquid photoresist composition is used, it may be applied to a substrate by any known means, such as spinning, dipping, roller coating and the like.

The present photoresist compositions may be used on a variety of substrates used in the manufacture of electronic devices such as printed wiring boards and integrated circuits. Suitable substrates include copper surfaces of copper clad boards, printed wiring board inner layers and outer layers, wafers used in the manufacture of integrated circuits and the like.

Once the photoresist is applied to the substrate, it is imaged or exposed to actinic radiation through appropriate artwork. In the case of a negative-acting photoresist, exposure of actinic radiation polymerizes the cross-linking agent in exposed areas, resulting in a cross-linked structure that is resistant to developer. Next, the composition is developed such as by using dilute alkaline aqueous solution. Suitable developers include 1–3 wt % aqueous solutions of sodium hydroxide or potassium hydroxide. Organic based developers, such as tetraalkylammonium hydroxide based developers, may be used but are less preferred. During such development, the acidic groups of the binder polymers form salts which render the binder polymers soluble and removable.

In the case of negative-acting photoresists applied to copper surfaces of copper clad boards, an etchant may be used after development to remove copper from those areas where the photoresist was removed, thereby forming a printed circuit. The remaining resist is then removed using a stripper.

Thus, the present invention provides a method of manufacturing a printed wiring board including the steps of: a) disposing on a printed wiring board substrate a photoresist composition including a polymeric binder, a photoactive component, a photoresist strip enhancer and optionally a cross-linking agent, wherein the organic acid is non-polymerizable with the polymeric binder and optional cross-linking agent and has the formula

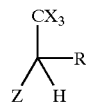

wherein each X is independently chlorine, bromine, fluorine or iodine; Z=cyano, aryl, substituted aryl, C(Y)—R$^1$, C≡C—R$^2$ and C(R$^3$)=CR$^4$R$^5$; Y=oxygen or sulfur; R=Z, hydrogen, (C$_1$-C$_4$)alkyl, (C$_1$-C$_4$)alkoxy, substituted (C$_1$-C$_4$)alkyl, substituted (C$_1$-C$_4$)alkoxy; R$^1$=(C$_1$-C$_8$)alkyl, (C$_1$-C$_8$)alkoxy, substituted (C$_1$-C$_8$)alkyl, substituted (C$_1$-C$_8$)alkoxy, aryl or substituted aryl; R$^2$=hydrogen, (C$_1$-C$_8$)alkyl, substituted (C$_1$-C$_8$)alkyl, aryl or substituted aryl; and R$^3$, R$^4$ and R$^5$ are independently selected from hydrogen, halogen or R$^1$; b) imaging the photoresist; and c) developing the photoresist.

The present photoresist compositions show enhanced removal as compared to conventional photoresist free of non-polymerizable organic acids. Thus, the present invention also provides a method of enhancing the removal of a photoresist composition from a substrate including the step of combining a photoresist strip enhancer with a photoresist composition including polymeric binder, a photoactive component and optionally a cross-linking agent, wherein the photoresist strip enhancer is non-polymerizable with the polymeric binder, optional cross-linking agent or both and has the formula

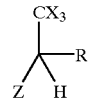

wherein each X is independently chlorine, bromine, fluorine or iodine; Z=cyano, aryl, substituted aryl, C(Y)—R$^1$, C≡C—R$^2$ and C(R$^3$)=CR$^4$R$^5$; Y=oxygen or sulfur; R=Z, hydrogen, (C$_1$-C$_4$)alkyl, (C$_1$-C$_4$)alkoxy, substituted (C$_1$-C$_4$)alkyl, substituted (C$_1$-C$_4$)alkoxy; R$^1$=(C$_1$-C$_8$)alkyl, (C$_1$-C$_8$)alkoxy, substituted (C$_1$-C$_8$)alkyl, substituted (C$_1$-C$_8$)alkoxy, aryl or substituted aryl; R$^2$=hydrogen, (C$_1$-C$_8$)alkyl, substituted (C$_1$-C$_8$)alkyl, aryl or substituted aryl; and R$^3$, R$^4$ and R$^5$ are independently selected from hydrogen, halogen or R$^1$organic acid with a photoresist composition including polymeric binder, a photoactive component and optionally a cross-linking agent, wherein the organic acid is non-polymerizable with the polymeric binder, optional cross-linking agent or both.

It has also been surprisingly found that non-polymerizable photoresist strip enhancers do not adversely affect other properties of the photoresist binder such as chemical resistance. Thus, the present photoresist compositions show improved stripping with substantially no loss of chemical resistance, as compared to the same compositions free of non-polymerizable photoresist strip enhancing compounds.

The following examples are intended to illustrate further various aspects of the present invention, but are not intended to limit the scope of the invention in any aspect.

EXAMPLE 1

Four dry film, negative-acting photoresist compositions, Samples A–D, were prepared by combining the components in the amounts listed in Table 1. The polymeric binders were acid-functional. The curing agents used were a mixture of ethoxylated TMPTA and the reaction product of ε-caprolactone and HEA as a hydroxy-functional mono-acrylate monomer, in a 1:1 ratio by weight, and having a net acrylate functionality of about 2. The photoinitiator system used was a mixture of free radical generators. A mixture of 2 adhesion promoters was used in each of the Samples. Each sample contained trichloromethylbenzyl acetate ("TCMBA") as a hydrophobic trihalomethyl containing photoresist strip enhancer. 1,4-Cyclohexanedicarboxylic acid, a non-polymerizable organic acid, was added to Sample D. The dye package used was a phototropic agent dye mixture. Each of Samples A–D was prepared as a dry film photoresist using conventional processing techniques.

TABLE 1

| Sample: | A | B | C | D |
|---|---|---|---|---|
| (Meth)acrylate Binder Polymer 1 (g) | 0 | 0 | 0 | 40 |
| (Meth)acrylate Binder Polymer 2 (g) | 36 | 36 | 36 | 0 |

TABLE 1-continued

| Sample: | A | B | C | D |
|---|---|---|---|---|
| (Meth)acrylate Binder Polymer 4 (g) | 4 | 4 | 4 | 0 |
| Curing Agents (g) | 28 | 28 | 28 | 28 |
| Photoinitiator System (g) | 2.5 | 2.5 | 2.5 | 6 |
| 1,4-Cyclohexane dicarboxylic acid (g) | 0 | 0 | 0 | 2 |
| TCMBA (g) | 1 | 3 | 5 | 1 |
| Adhesion Promoters (g) | 0.1 | 0.1 | 0.1 | 0.1 |
| Dye Package (g) | 0.6 | 0.6 | 0.6 | 0.6 |
| Other Components (g) | 0.1 | 0.1 | 0.1 | 0.3 |

EXAMPLE 2

Samples A–D of Example 1 were applied to separate panels. Two comparative samples, C-1 and C-2, were also applied to separate panels. Each panel was treated in the same manner, i.e. they were treated using the same pre-plate procedure, cleaning procedure, and the like. Comparative C-1 was a commercially available dry film, negative-acting plating resist available from Shipley Company (Marlborough, Mass.) and included an acid functional (meth)acrylate binder, a curing agent including a cross-linking agent and a mono-(meth)acrylate, a free-radical generating photoinitiator system, and a dye package. Comparative C-1 did not contain a curing agent system having a net acrylate functionality of about 2, a non-polymerizable organic acid nor did C-1 contain any hydrophobic trihalomethyl containing photoresist strip enhancers. Comparative C-2 was a commercially available dry-film plating resist (RISTON™ 9020) available from Dupont Printed Circuits (Wilmington, Del.), and did not contain a non-polymerizable organic acid nor did C-1 contain any hydrophobic trihalomethyl containing photoresist strip enhancers.

Panels containing resist Samples A–D and Comparative Samples C-1 and C-2 were evaluated for develop breakpoint, relative photospeed, post exposure contrast, post develop resist sidewall shape, copper/tin plating performance and resist strip time. The results of these evaluations are reported in Table 2. Photospeed was determined using a Stouffer 21 step wedge, copper step 9, at 50% (i.e. when the unexposed resist was washed off half-way through the development chamber). The post exposure contrast was a visual inspection of the panel for the color difference between the exposed and unexposed regions, with a rating of "1" being the best.

Post development resist sidewall shape was determined using scanning electron microscopy. Scanning electron micrographs of the panels after development were evaluated to determine the degree of undercutting and/or footing of the resist sidewall. A sidewall rating of "1" represents substantially no undercutting or footing while a rating of "2" or "3" indicates some undercutting or footing of the resist sidewall.

Copper/tin ("Cu/Sn") plating performance is a measure of the platability of the resist. Under this performance test, vertical copper plated trace is examined to determine whether the resist was washed out. Washing out of the resist can be determined by underplating of copper. A one square centimeter piece was punched out of each panel and examined under an optical microscope to visually determine the amount of such underplating. A rating of "1" indicates substantially no underplating, while a rating of "2" or "3" indicates varying degrees of underplating.

Resist strip time is the time in seconds for complete strip or removal of the resist using 3% caustic at 130° F.

TABLE 2

| Sample: | A | B | C | D | C-1* | C-2* |
|---|---|---|---|---|---|---|
| Develop Breakpoint (seconds) | 25.6 | 24.6 | 24.0 | 25.9 | 24.8 | 25.1 |
| Photospeed (Cu 9,50%) (mJ/cm²) | 168 | 168 | 168 | 60 | 84 | 84 |
| Post Exposure Contrast | 1 | 1 | 1 | 1 | 3 | 2 |
| Post Develop Resist Sidewall Shape | 1 | 1 | 1 | 1 | 3 | 1 |
| Cu/Sn Plating Performance | 1 | 1 | 1 | 1 | 1 | 2 |
| Resist Strip Time seconds | 37.8 | 36.9 | 38.2 | 35.7 | 50.3 | 52.2 |

The above data clearly show that the photoresist compositions of the present invention have improved characteristics as compared to conventional dry film photoresists and can also be removed significantly faster than such conventional photoresists.

What is claimed is:

1. A photoresist composition comprising a polymeric binder, a photoactive component, a photoresist strip enhancer selected from the group consisting of alpha-trichloromethyl benzyl acetate, alpha-tribromomethyl benzyl acetate, alpha-triiodomethyl benzyl acetate, trichloromethyl allyl acetate, tribromomethyl allyl acetate, alpha-trichloromethyl benzyl propionate, alpha-tribromomethyl benzyl propionate, alpha-triiodomethyl benzyl propionate, trichloromethyl allyl propionate, tribromomethyl allyl propionate, alpha-trichloromethyl benzyl benzoate, alpha-tribromomethyl benzyl benzoate, alpha-triiodomethyl benzyl benzoate, trichloromethyl allyl benzoate, tribromomethyl allyl benzoate and alpha-bromodichloromethyl benzyl acetate and optionally a cross linking agent, wherein the photoresist strip enhancer is non-polymerizable with the polymeric binder, optional cross-linking agent or both

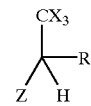

2. The composition of claim 1 wherein the photoactive component is selected from the group consisting of 9-phenylacridine, n-phenylglycine, benzophenone, N,N'-tetramethyl-4,4'-diaminobenzophenone, N,N'-tetrethyl-4,4'-diaminobenzophenone, 4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone, benzoin, benzoinmethylether, benzoinethylether, benzoinisopropylether, benzoin-n-butylether, benzoin-phenylether, methylbenzoin, ethylbenzoin, dibenzyl, benzyldiphenyldisulfide, benzyldimethylketal, 1,7-bis(9-acridinyl)heptane, 2-chlorothioxanthone, 2-methylthioxanthone, 2,4-diethylthioxanthone, 2,4-dimethylthioxanthone, 2-isopropylthioxanthone, 1,1-dichloroacetophenone, p-t-butyldichloroacetophenone, 2,2-diethoxyacetophenone, 2,2-dimethoxy-2-phenylacetophenone, 2,2-dichloro-4-phenoxyacetophenone, 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5- diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer.

3. The composition of claim 1 wherein the polymeric binder comprises sufficient acid functionality to render said photoresist composition developable in alkaline aqueous solution.

4. The composition of claim 3 wherein the polymeric binder has an acid number of from about 50 to about 250.

5. The composition of claim 1 wherein the photoresist strip enhancer is present in an amount up to 10% by wt.

6. A method of enhancing the removal of photoresist composition from a substrate comprising the step of combining a photoresist strip enhancer selected from the group consisting of alpha-trichloromethyl benzyl acetate, alpha-tribromomethyl benzyl acetate, alpha-triiodomethyl benzyl acetate, trichloromethyl allyl acetate, tribromomethyl allyl acetate, alpha-trichloromethyl benzyl propionate, alpha tribromomethyl benzyl propionate, alpha-triiodomethyl benzyl propionate, trichloromethyl allyl propionate, tribromomethyl allyl propionate, alpha-trichloromethyl benzyl benzoate, alpha-tribromomethyl benzyl benzoate, alpha-triiodomethylbenzyl benzoate, trichloromethyl allyl benzoate, tribromomethyl allyl benzoate and alpha-bromodichloromethyl benzyl acetate with a photoresist composition comprising a polymeric binder, a photoactive component and optionally a cross-linking agent, wherein the photoresist strip enhancer in non-polymerizable with the polymeric binder, optionally cross-linking agent or both

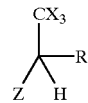

7. A method of manufacturing a printed wiring board comprising the steps of a) disposing on a printed wiring board substrate a photoresist composition comprising a polymeric binder, a photoactive component, a photoresist strip enhancer selected from the group consisting of alpha-trichloromethyl benzyl acetate, alpha-tribromomethyl benzyl acetate, alpha-triiodomethyl benzyl acetate, trichloromethyl allyl acetate, tribromomethyl allyl acetate, alpha-trichloromethyl benzyl propionate, alpha-tribromomethyl benzyl propionate, alpha-triiodomethyl benzyl propionate, trichloromethyl allyl propionate, tribromomethyl allyl propionate, alpha-trichloromethyl benzyl benzoate, alpha-tribromomethyl benzyl benzoate, alpha-triiodomethylbenzyl benzoate, trichloromethyl allyl benzoate, tribromomethyl allyl benzoate and alpha-bromodichloromethyl benzyl acetate and optionally a cross-linking agent, wherein the photoresist strip enhancer is non-polymerizable with the polymeric binder and optional cross-linking agent

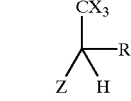

b) imaging the photoresist; and c) developing the photoresist.

* * * * *